United States Patent
Wu et al.

(10) Patent No.: US 7,855,392 B2
(45) Date of Patent: Dec. 21, 2010

(54) OPTOELECTRONIC SEMICONDUCTOR COMPONENT CAPABLE OF CENTRALIZING EMITTED LIGHT

(75) Inventors: Yung-Fu Wu, Taipei County (TW); He-Feng Zhang, Tianjin (CN)

(73) Assignee: Lite-On Technology Corp., Taipei (TW)

( * ) Notice: Subject to any disclaimer, the term of this patent is extended or adjusted under 35 U.S.C. 154(b) by 266 days.

(21) Appl. No.: 12/117,723

(22) Filed: May 8, 2008

(65) Prior Publication Data
US 2009/0141516 A1 Jun. 4, 2009

(30) Foreign Application Priority Data
Dec. 3, 2007 (TW) .............................. 96145933 A

(51) Int. Cl.
*H01L 33/00* (2010.01)
(52) U.S. Cl. .............................. 257/98; 257/97; 257/99; 362/249.02; 362/311.02
(58) Field of Classification Search ................ 362/800, 362/265, 297, 311.02, 346, 348, 249.01; 257/97–99; 361/728–736, 806, 807, 720, 361/723
See application file for complete search history.

(56) References Cited

U.S. PATENT DOCUMENTS

| | | | | |
|---|---|---|---|---|
| 6,811,277 B2 * | 11/2004 | Amano | ....................... | 362/602 |
| 7,083,299 B2 * | 8/2006 | Chapman | .................... | 362/188 |
| 7,161,187 B2 * | 1/2007 | Suehiro et al. | ................ | 257/98 |
| 7,470,042 B2 * | 12/2008 | Ayabe et al. | ................ | 362/297 |
| 2009/0237942 A1 * | 9/2009 | Lam et al. | .................... | 362/308 |

* cited by examiner

*Primary Examiner*—Anabel M Ton
(74) *Attorney, Agent, or Firm*—Rosenberg, Klein & Lee

(57) ABSTRACT

An optoelectronic semiconductor component includes a light-emitting chip for emitting light, and a reflective substrate. A plurality of linear indent structures is formed on the reflective substrate. The light-emitting chip is installed on the reflective substrate and located on a side of the plurality of linear indent structures. The plurality of linear indent structures is capable of reflecting the light emitted from the light-emitting chip.

33 Claims, 13 Drawing Sheets

OPTOELECTRONIC SEMICONDUCTOR COMPONENT CAPABLE OF CENTRALIZING EMITTED LIGHT

BACKGROUND OF THE INVENTION

1. Field of the Invention

The invention relates to an optoelectronic semiconductor component and a side-emitting backlight module.

2. Description of the Prior Art

Recently, new application fields of high-illumination light emitting diodes (LEDs) have been developed. Different from a common incandescent light, a cold illumination LED has the advantages of low power consumption, long device lifetime, no idle time, and quick response speed. In addition, since LED also have the advantages of small size, vibration resistance, suitability for mass production, and easy fabrication as a tiny device or an array device, they have been widely applied in display apparatuses and indicating lamps of information, communication, and consumer electronics products. LEDs are not only utilized in outdoor traffic signal lamps or various outdoor displays, but also are very important components in the automotive industry. Furthermore, LEDs also work well in portable products, such as cell phones and backlights of personal data assistants. The LED has become a necessary component in the very popular liquid crystal display because it is the best choice for the light source of the backlight module.

Referring to FIG. 1, FIG. 1 illustrates a schematic view of an optoelectronic semiconductor component 10 according to the prior art. The optoelectronic semiconductor component 10 includes a light emitting chip 12 for emitting light; a reflective base 14 for reflecting light produced by the light emitting chip 12; an encapsulant 16 formed in the reflective base 14 to enclose the light emitting chip 12; and an electrode 18 for receiving electricity from an external power supply. Preferably, the light emitting chip 12 is a light emitting diode chip, the light emitting chip 12 is installed on one side of the reflective base 14, and the encapsulant 16 is composed of fluorescent material, light dispersing material, or ink. As shown in FIG. 1, the planar design of the reflective base 14 often causes light reflected by the reflective base 14 or light emitted by the light emitting chip 12 to scatter toward all different directions. In other words, the reflected or emitted lights are scattered toward different angles, which ultimately decreases the viewing angle and overall luminance of the optoelectronic semiconductor component 10.

To solve the aforementioned problem, a dome lens is installed on the light exit plane of the optoelectronic semiconductor component 30. Referring to FIG. 2, FIG. 2 illustrates another optoelectronic semiconductor component 30 according to the prior art. The optoelectronic semiconductor component 30 includes a light emitting chip 32 for emitting light, a reflective base 34 for reflecting light produced by the light emitting chip 32, an encapsulant 36 disposed in the reflective base 34 to enclose the light emitting chip 32, and an electrode 38 for receiving electricity from an external power supply. Preferably, the light emitting chip 32 is a light emitting diode chip, the light emitting chip 32 is installed on one side of the reflective base 34, and the encapsulant 36 is composed of florescent material, light dispersing material, or ink. A dome lens 40 is further installed on one side of the reflective base 34 and the encapsulant 36. The dome lens 40 is specifically used to centralize light reflected by the reflective base 34 and light emitted directly from the light emitting chip 32, thereby reducing the viewing angle and increasing the overall luminance of the optoelectronic semiconductor component 30. Unfortunately, the utilization of the dome lens 40 not only increases the height and thickness of the entire package structure, but also raises the difficulty of using surface mounting technique and pick and place process to fabricate the semiconductor component 30. Hence, how to fabricate a novel optoelectronic semiconductor component capable of producing frontal and centralized lights while improving the overall brightness of the device has become an important task in this field.

SUMMARY OF THE INVENTION

It is an objective of the present invention to provide an optoelectronic semiconductor component and a side-emitting backlight module capable for centralizing lights to solve the aforementioned problems.

An optoelectronic semiconductor component is disclosed. The optoelectronic semiconductor component includes a light emitting chip for emitting light and a reflective substrate having a plurality of linear indented structures thereon. Preferably, the light emitting chip is installed on the reflective substrate and positioned on one side of the linear indented structures, and the linear indented structures are capable of reflecting light emitted from the light emitting chip.

A side-emitting backlight module is disclosed. The side-emitting backlight module includes an optoelectronic semiconductor component, in which the optoelectronic semiconductor component further comprises: a light emitting chip for emitting light; and a reflective substrate having a plurality of linear indented structures thereon, wherein the light emitting chip is installed on the reflective substrate and positioned on one side of the linear indented structures, and the linear indented structures are capable of reflecting light emitted from the light emitting chip. The side-emitting backlight module also includes a light guiding plate installed on one side of the optoelectronic semiconductor component for guiding light reflected by the linear indented structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
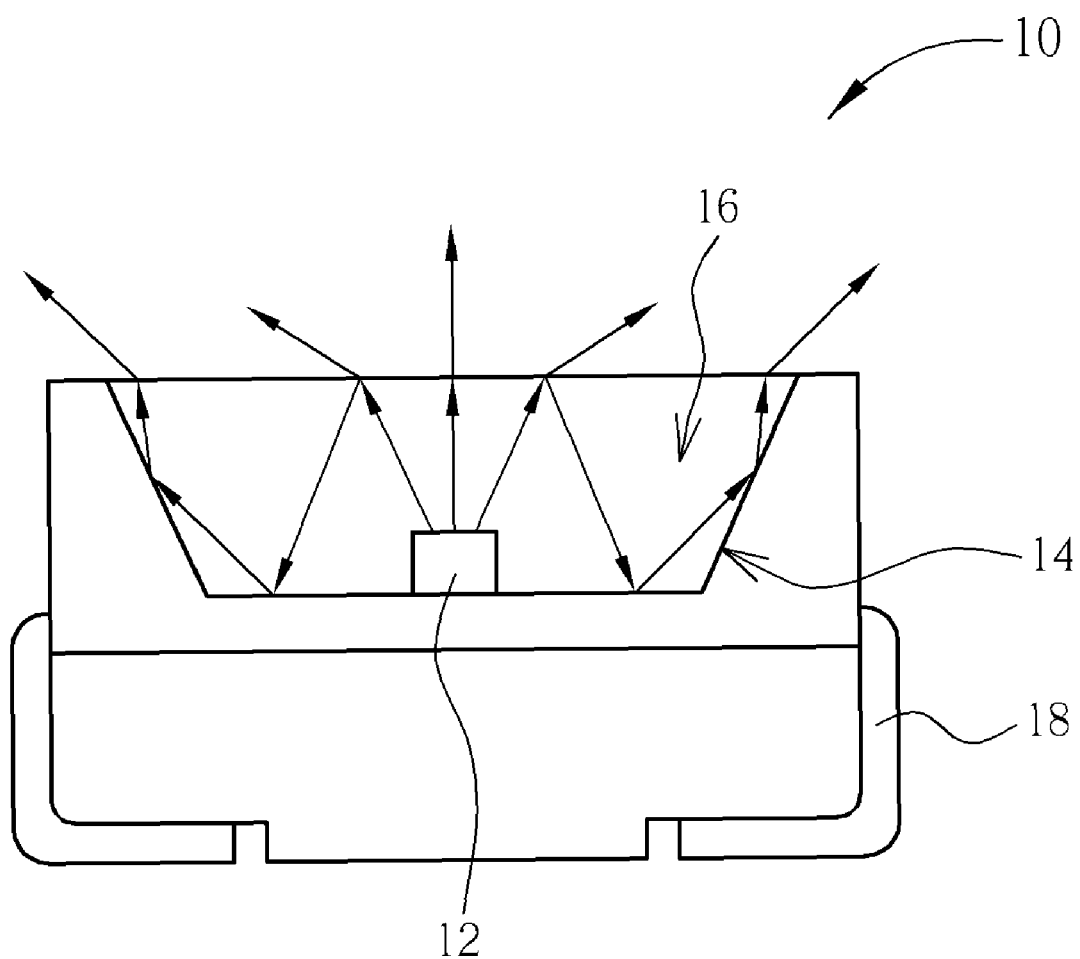
FIG. 1 illustrates a schematic view of an optoelectronic semiconductor component according to the prior art.
Figure 2:
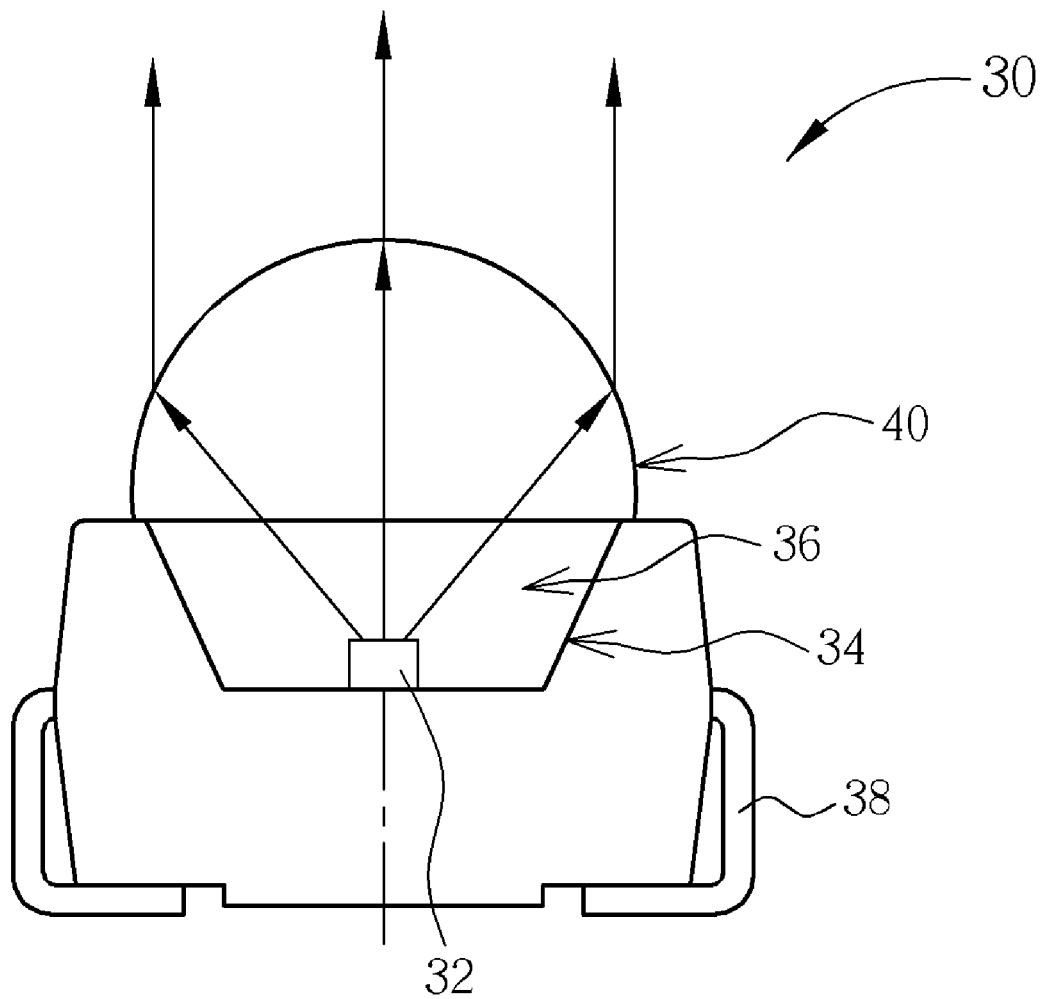
FIG. 2 illustrates another optoelectronic semiconductor component according to the prior art.
Figure 3:
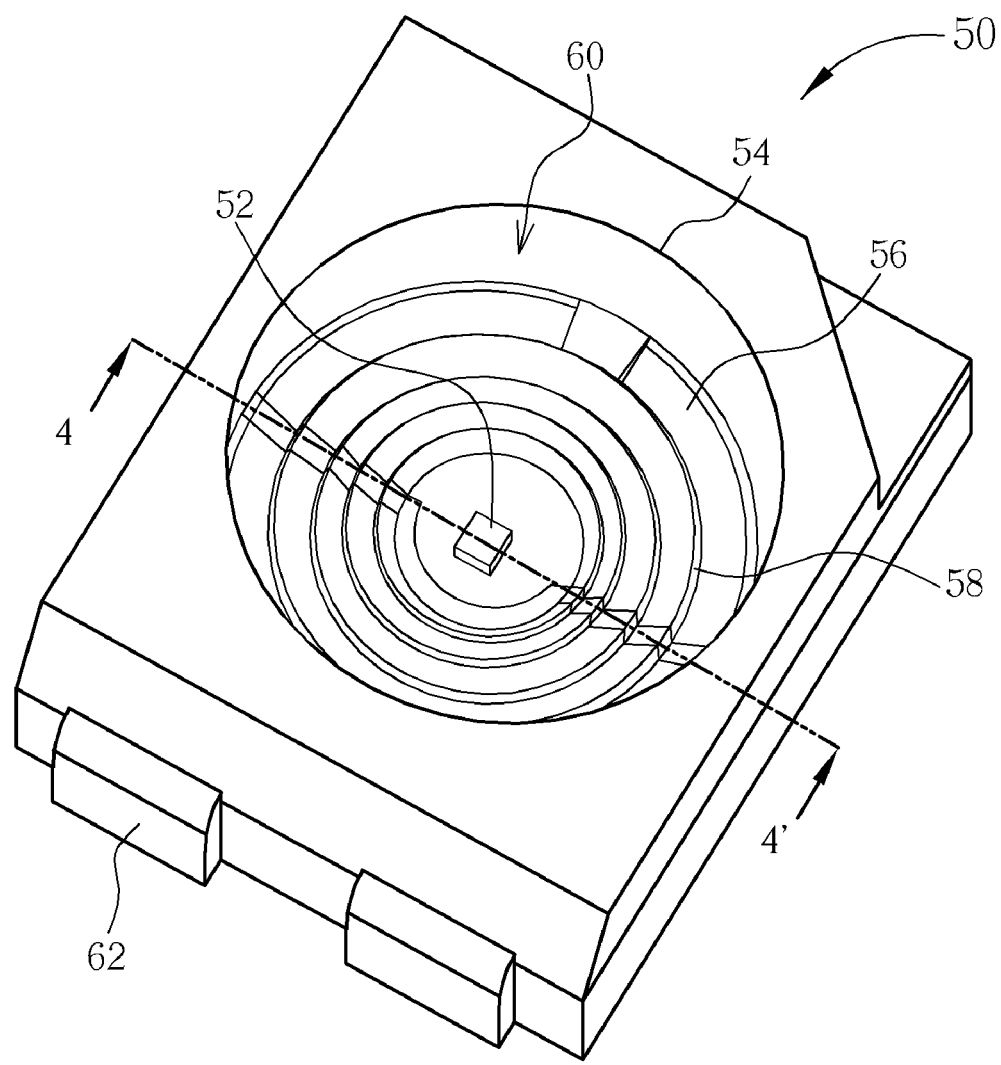
FIG. 3 illustrates a perspective view of an optoelectronic semiconductor component according to a first embodiment of the present invention.
Figure 4:
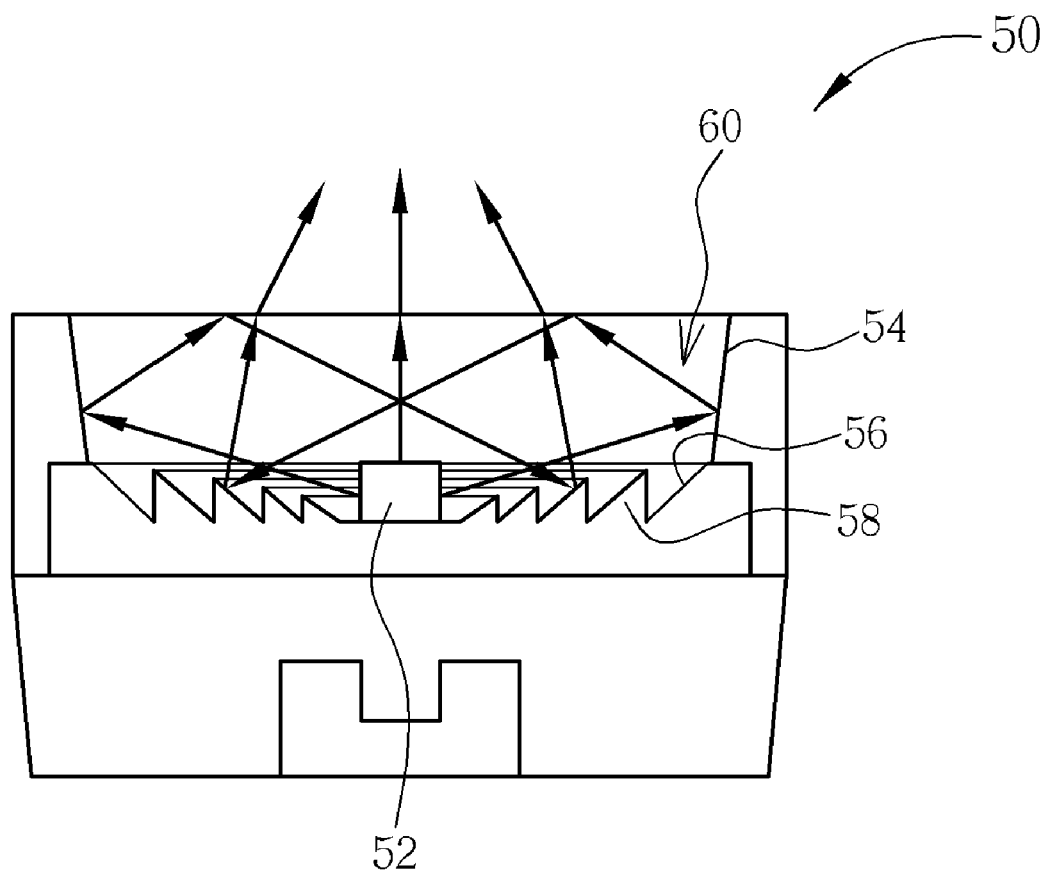
FIG. 4 illustrates a cross-sectional view of the optoelectronic semiconductor component of FIG. 3 along the sectional line 4-4'.

Referring to FIGS. 3-4, FIG. 3 illustrates a perspective view of an optoelectronic semiconductor component 50 according to the first embodiment of the present invention. FIG. 4 illustrates a cross-sectional view of the optoelectronic semiconductor component 50 of FIG. 3 along the sectional line 4-4'. The optoelectronic semiconductor component 50 is a plastic leaded chip carrier (PLCC) light emitting diode component, in which the optoelectronic semiconductor component 50 includes a light emitting chip 52 for emitting light, a reflective base 54 for emitting light emitted by the light emitting chip 52, and a reflective substrate 56 installed on one side of the reflective base 54. Preferably, the light emitting chip 52 is a light emitting diode chip, the light emitting chip 52 is installed on one side of the reflective base 54, and a plurality of linear indented structures 58 are formed on the reflective substrate 56. The light emitting chip 52 is further installed on the reflective substrate 56 and positioned on one side of the linear indented structures 58. In this embodiment, the linear indented structures 58 are formed to surround the light emitting chip 52 according to a circular or elliptical manner, and this formation preferably forms each of the linear indented structures 58 into a Fresnel Lens. The reflective substrate 56 can be composed of metal or plastic, a material having high reflectivity can be coated over the surface of the reflective substrate 56 via evaporation, or a metal can be electroplated onto the reflective substrate 56 to increase the reflectivity of the reflective substrate 56. The linear indented structures 56 can be formed by injection molding or stamping, in which the structures 56 are specifically used to reflect lights emitted from the light emitting chip 52. An encapsulant 60 formed by an encapsulation process is also deposited in the reflective base 54 to cover the light emitting chip 52. The encapsulant 60 is composed of epoxy or silicone, which may also include substances such as fluorescent materials, light dispersing materials, or ink. An electrode 62 is formed to receive electricity transmitted from an external power supply.

The optoelectronic semiconductor component 50 specifically uses the linear indented structures 58 of the reflective substrate 56 to reflect lights emitted by the light emitting chip 52. As each linear indented structure 58 is fabricated to form an analogous Fresnel Lens, which typically has a characteristic for gathering lights, the present invention could use the linear indented structures 58 to centralize the lights emitted by the light emitting chip 52 and cause the lights exiting the encapsulant 60 to have an incident angle of approximately 90 degrees. In other words, lights exiting the component 50 would not scatter toward all different directions. Instead, lights would be gathered and projected toward one single direction, which ultimately increases the overall brightness of the optoelectronic semiconductor component 50. By using the design of the present invention, the present invention could maintain the advantage of using the conventional planar lens design while eliminating the need of installing a dome lens, which not only facilitates the utilization of surface mounting technique to fabricate the optoelectronic semiconductor component 50, but also controls the incident angle of light exiting the device accordingly. Overall, the luminance and optical coupling of the optoelectronic semiconductor component are significantly increased and the applicable field of this component is expanded.

Figure 5:
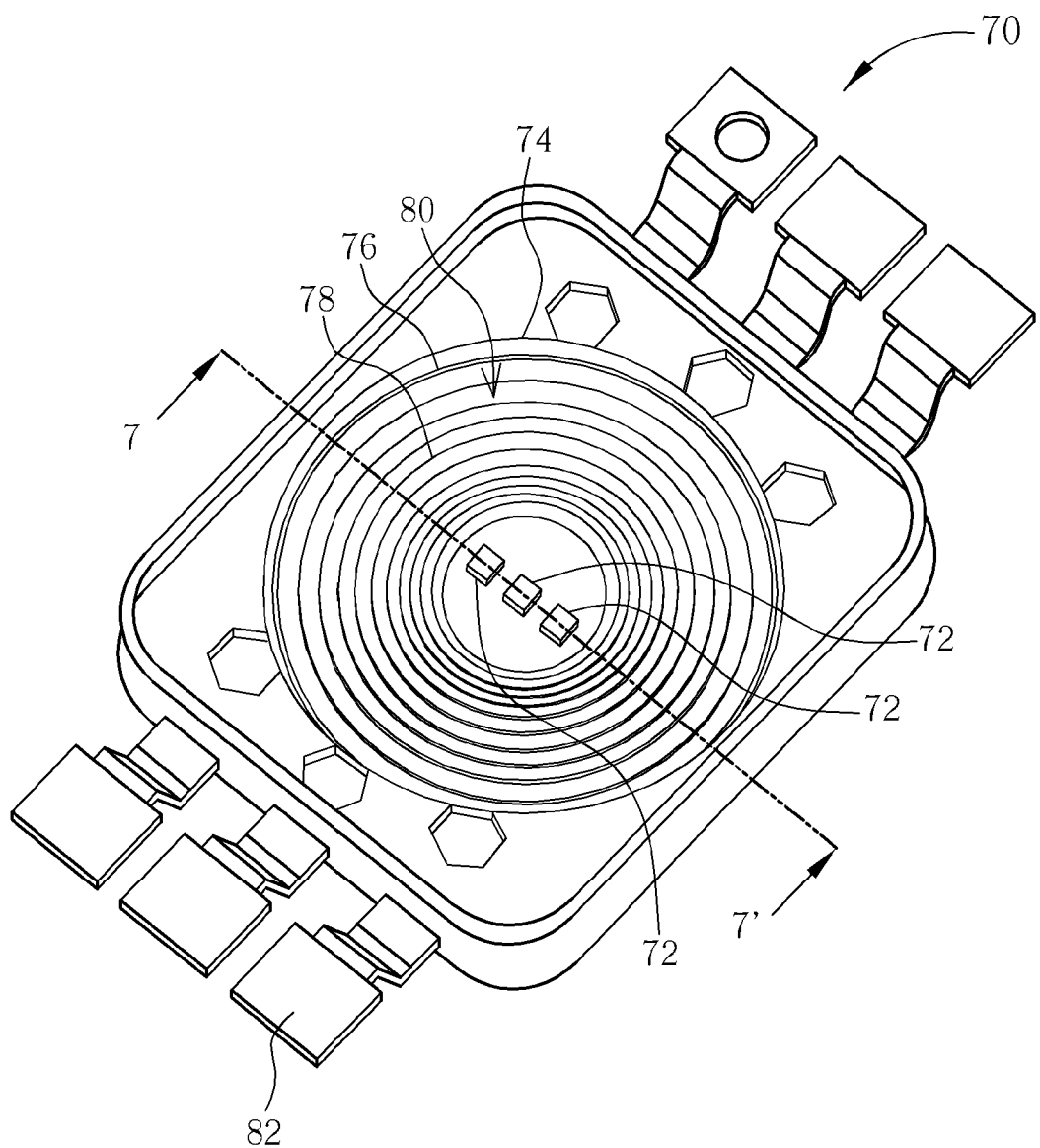
FIG. 5 illustrates a frontal view of an optoelectronic semiconductor component according to a second embodiment of the present invention.
Figure 6:
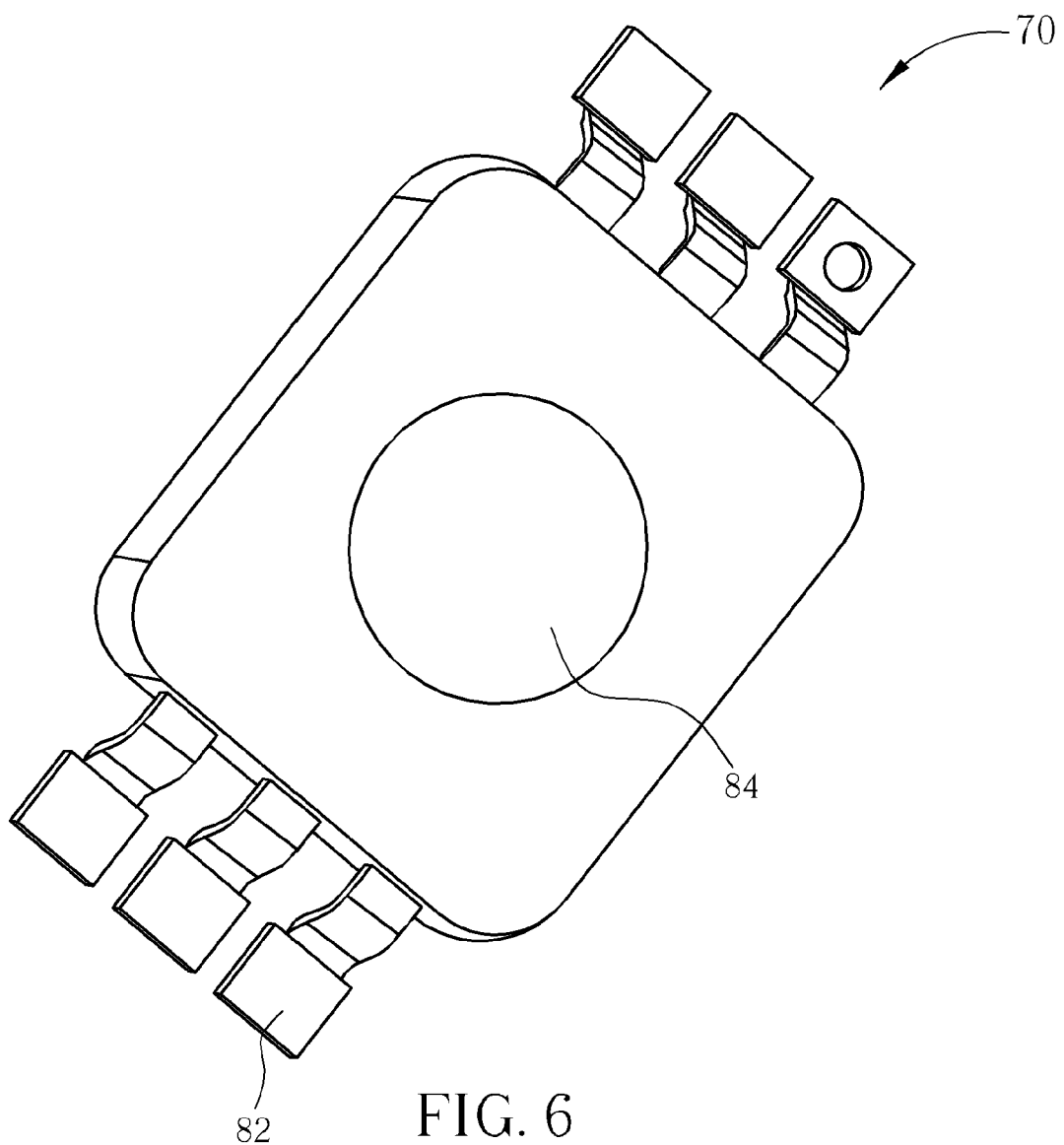
FIG. 6 illustrates a back view of the optoelectronic semiconductor component according to the second embodiment of the present invention.
Figure 7:
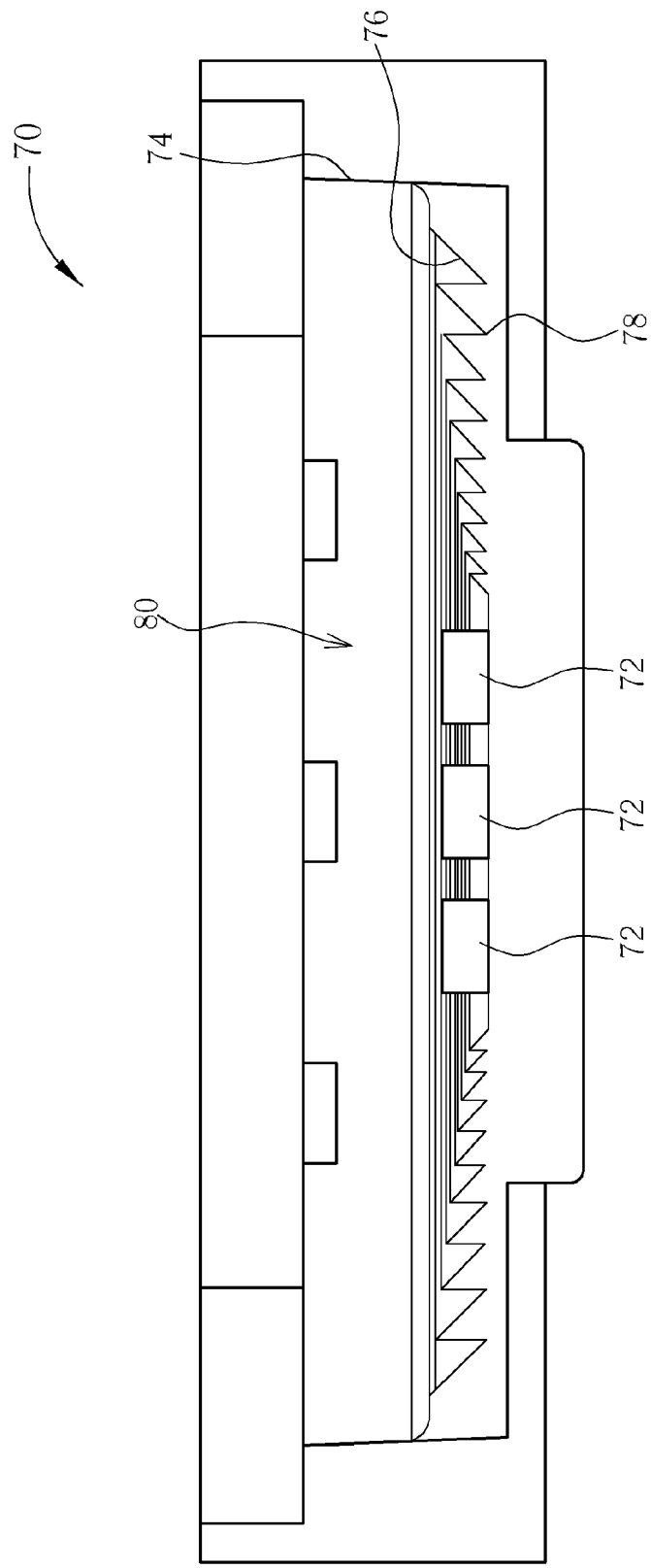
FIG. 7 illustrates a cross-section view of the optoelectronic semiconductor component of FIG. 5 along the sectional line 7-7'.

Referring to FIGS. 5-7, FIG. 5 illustrates a frontal view of an optoelectronic semiconductor component 70 according to a second embodiment of the present invention, FIG. 6 illustrates a back view of the optoelectronic semiconductor component 70, and FIG. 7 illustrates a cross-section view of the optoelectronic semiconductor component 70 of FIG. 5 along the sectional line 7-7'. The optoelectronic semiconductor component 70 is preferably a plastic leaded chip carrier light emitting diode chip package, in which the optoelectronic semiconductor component 70 includes a plurality of light emitting chips 72 for emitting lights of different colors. For instance, the light emitting chips 72 could be composed of chips having RGB colors, which could be further mixed to produce white light. The light emitting chips 72 are preferably light emitting diode chips. The optoelectronic semiconductor component 70 also includes a reflective base 74 for reflecting lights emitted by the light emitting chips 72 and a reflective substrate 76 installed on one side of the reflective base 74, in which the light emitting chips 72 are installed on one side of the reflective base 74. A plurality of linear indented structures 78 are formed on the reflective substrate 76, in which the light emitting chips 72 are further disposed on the reflective substrate 76 and positioned on one side of the linear indented structures 78. The optoelectronic semiconductor component 70 also includes an encapsulant 80 disposed in the reflective base 74 to cover the light emitting chips 72. The encapsulant 80 is preferably composed of epoxy or silicone and may contain substances such as fluorescent materials, light dispersing materials, or inks. An electrode 82 is formed to receive electricity from an external power supply. A thermal plate 84 is installed to guide heat generated by the light emitting chips 72 to the outside. The utilization of linear indented structures 78 to reflect lights emitted by the light emitting chip 72 is similar to the first embodiment and the details of which are not further explained herein for the sake of brevity.

Figure 8:
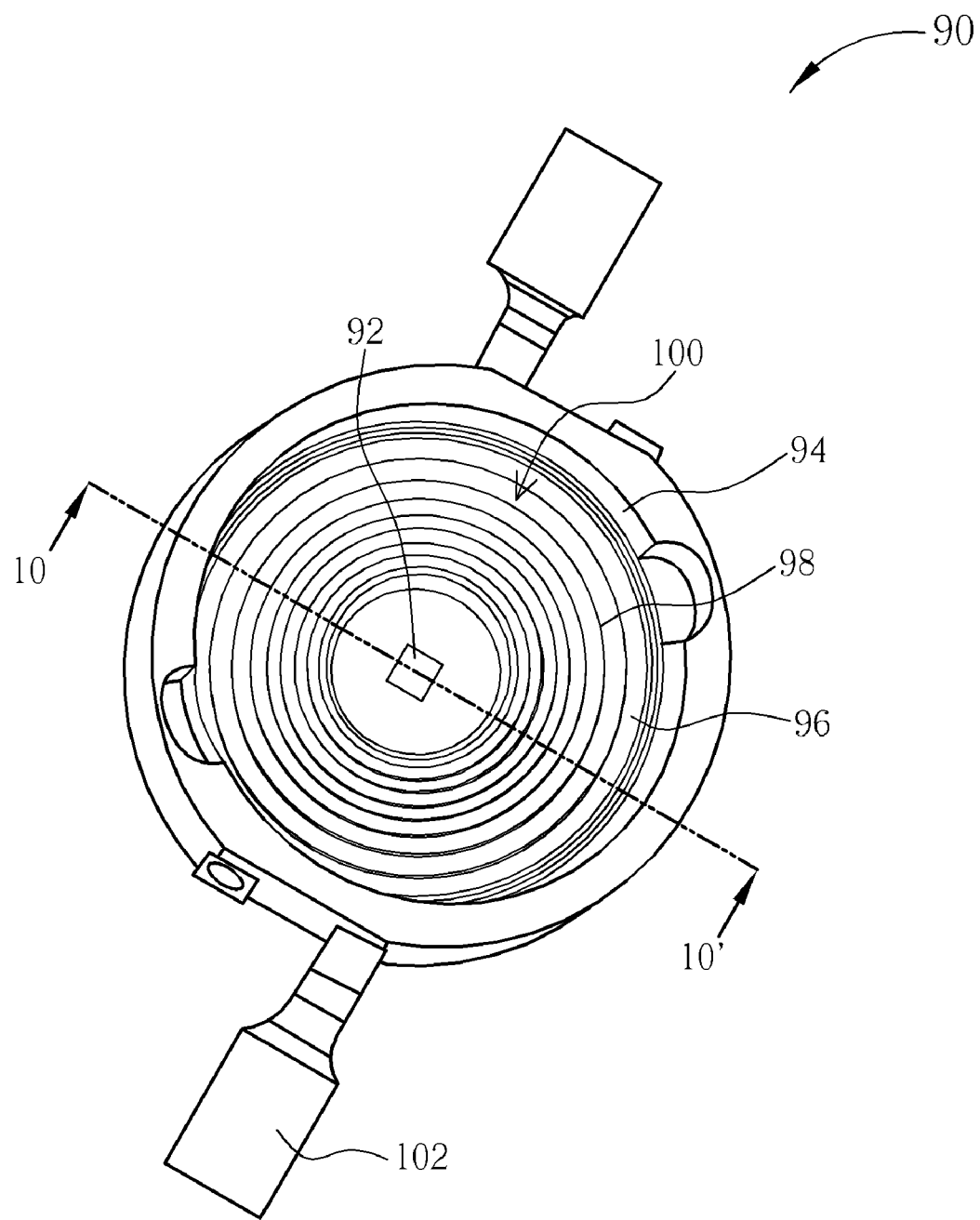
FIG. 8 illustrates a frontal view of an optoelectronic semiconductor component according to a third embodiment of the present invention.
Figure 9:
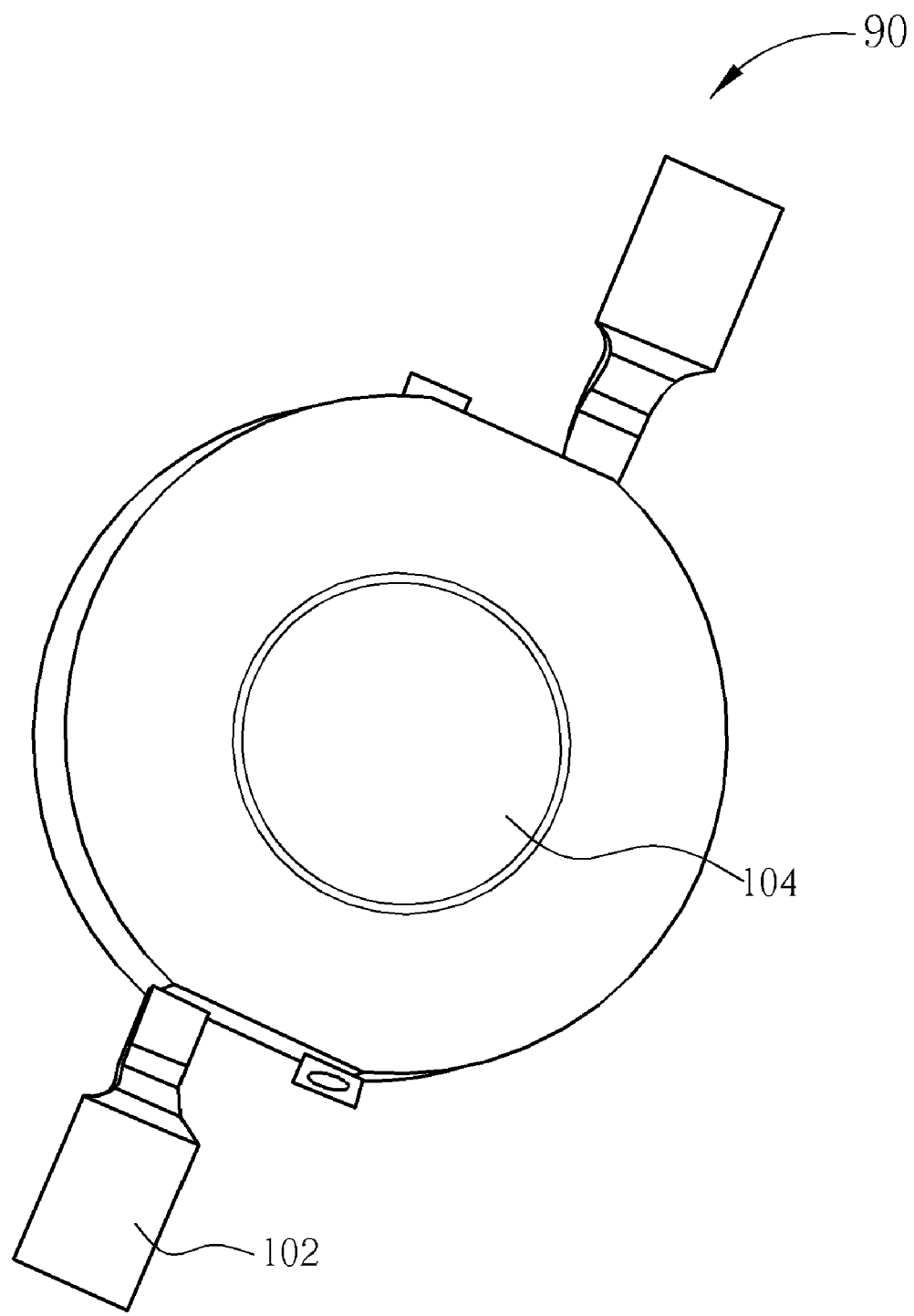
FIG. 9 illustrates a back view of the optoelectronic semiconductor component according to the third embodiment of the present invention.
Figure 10:
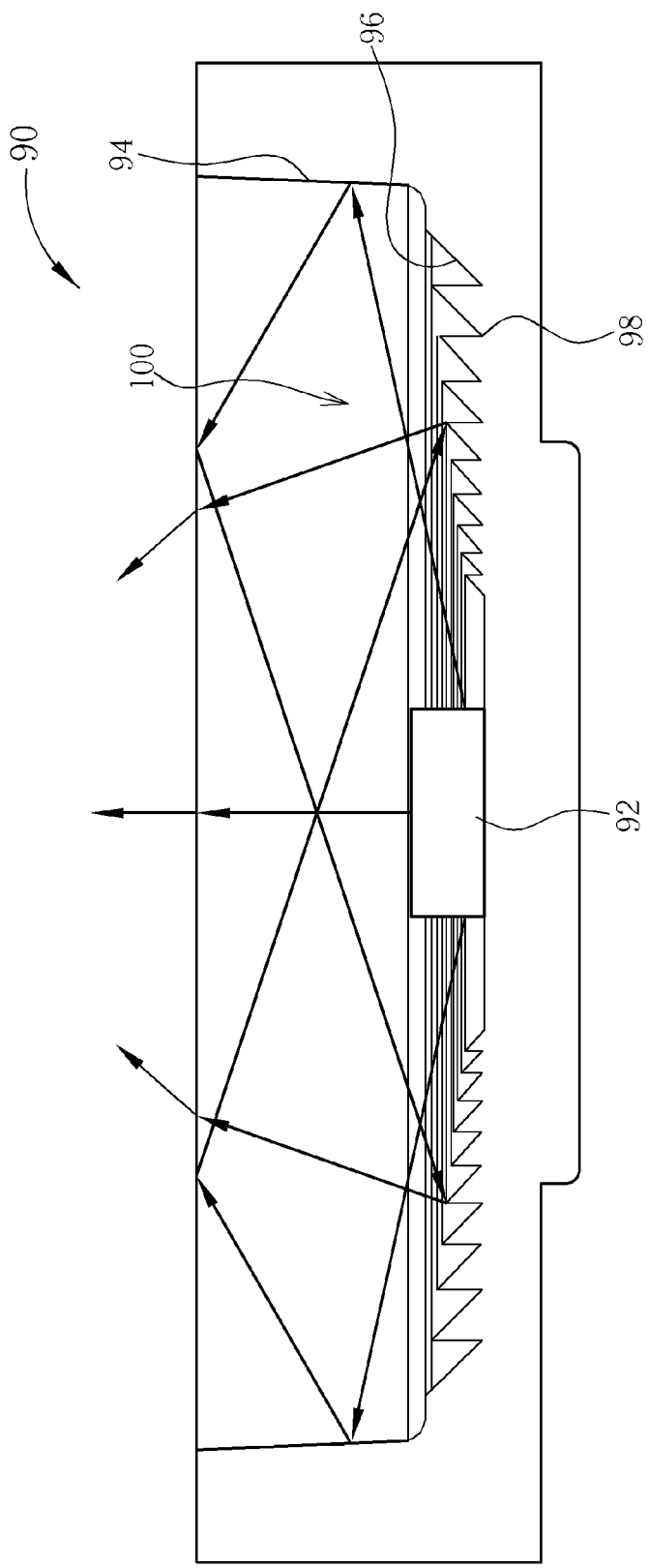
FIG. 10 illustrates a cross-section view of the optoelectronic semiconductor component of FIG. 8 along the sectional line 10-10'.

Referring to FIGS. 8-10, FIG. 8 illustrates a frontal view of an optoelectronic semiconductor component 90 according to a third embodiment of the present invention, FIG. 9 illustrates a back view of the optoelectronic semiconductor component 90, and FIG. 10 illustrates a cross-section view of the optoelectronic semiconductor component 90 of FIG. 8 along the sectional line 10-10'. The optoelectronic semiconductor component 90 Is preferably a high power plastic leaded chip carrier light emitting diode package, in which the optoelectronic semiconductor component 90 includes a plurality of light emitting chips 92 for emitting light, a reflective base 94 for reflecting light emitted by the light emitting chip 92, and a reflective substrate 96 installed on one side of the reflective base 94. The light emitting chip 92 can be a light emitting diode chip, the light emitting chip 92 is installed on one side of the reflective base 94, a plurality of linear indented structures 98 are formed on the reflective substrate 96, and the light emitting chip 92 is installed on the reflective substrate 96 and positioned on one side of the linear indented structures 98.

The optoelectronic semiconductor component 90 also includes an encapsulant 100 disposed in the reflective base 94 for protecting the light emitting chip 92. The encapsulant 100 is preferably composed of epoxy or silicone, which may also contain substance such as fluorescent materials, light dispersing materials, or inks. An electrode 102 is formed to receive electricity from an external power supply. A thermal plate 104 is installed to guide heat generated by the light emitting chip 92 to the outside. The utilization of the linear indented structures 98 for reflecting light emitted by the light emitting chip 92 is similar to the previous embodiment and the details of which are not further explained herein for the sake of brevity.

Figure 11:
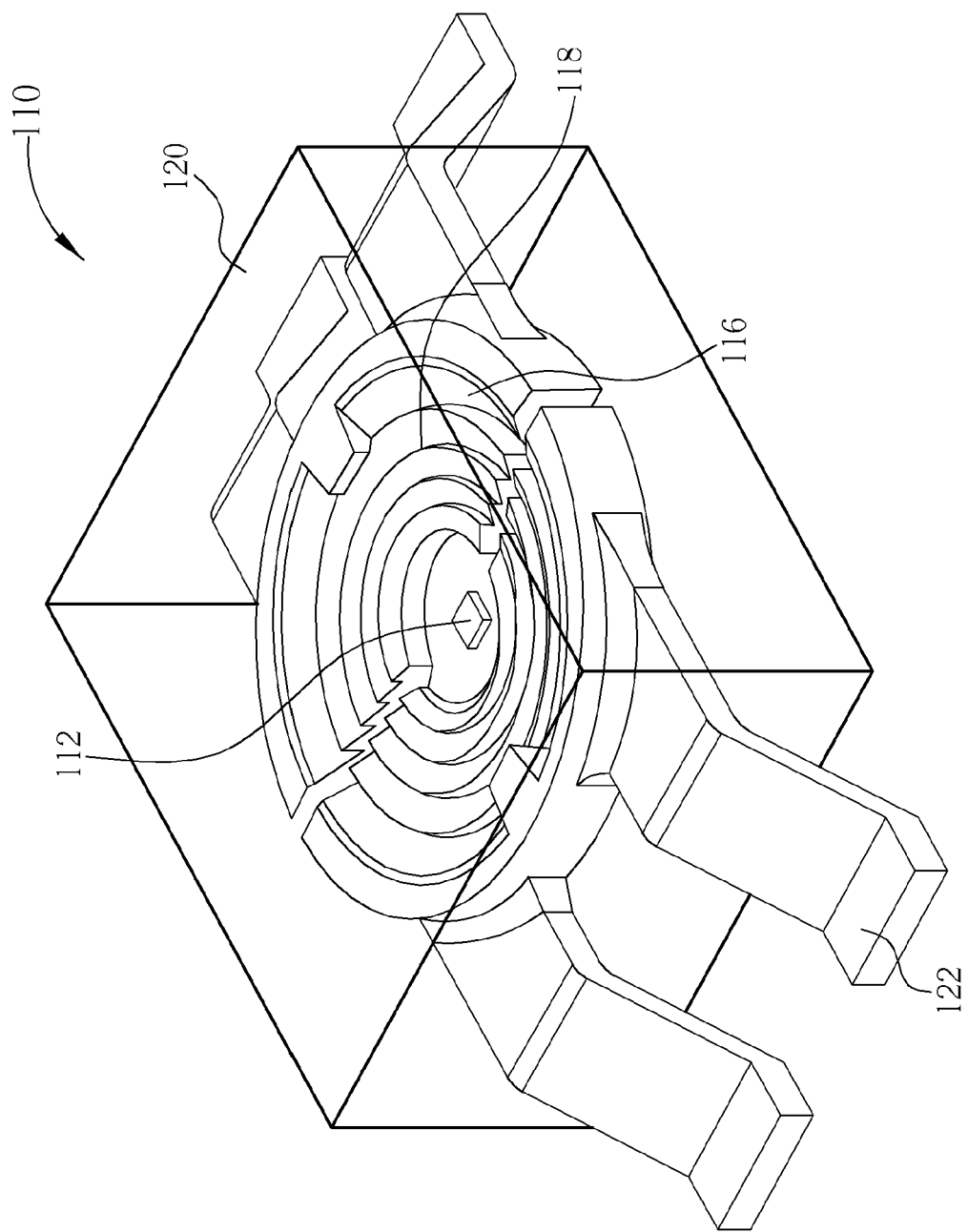
FIG. 11 illustrates a frontal view of an optoelectronic semiconductor component according to a fourth embodiment of the present invention.
Figure 12:
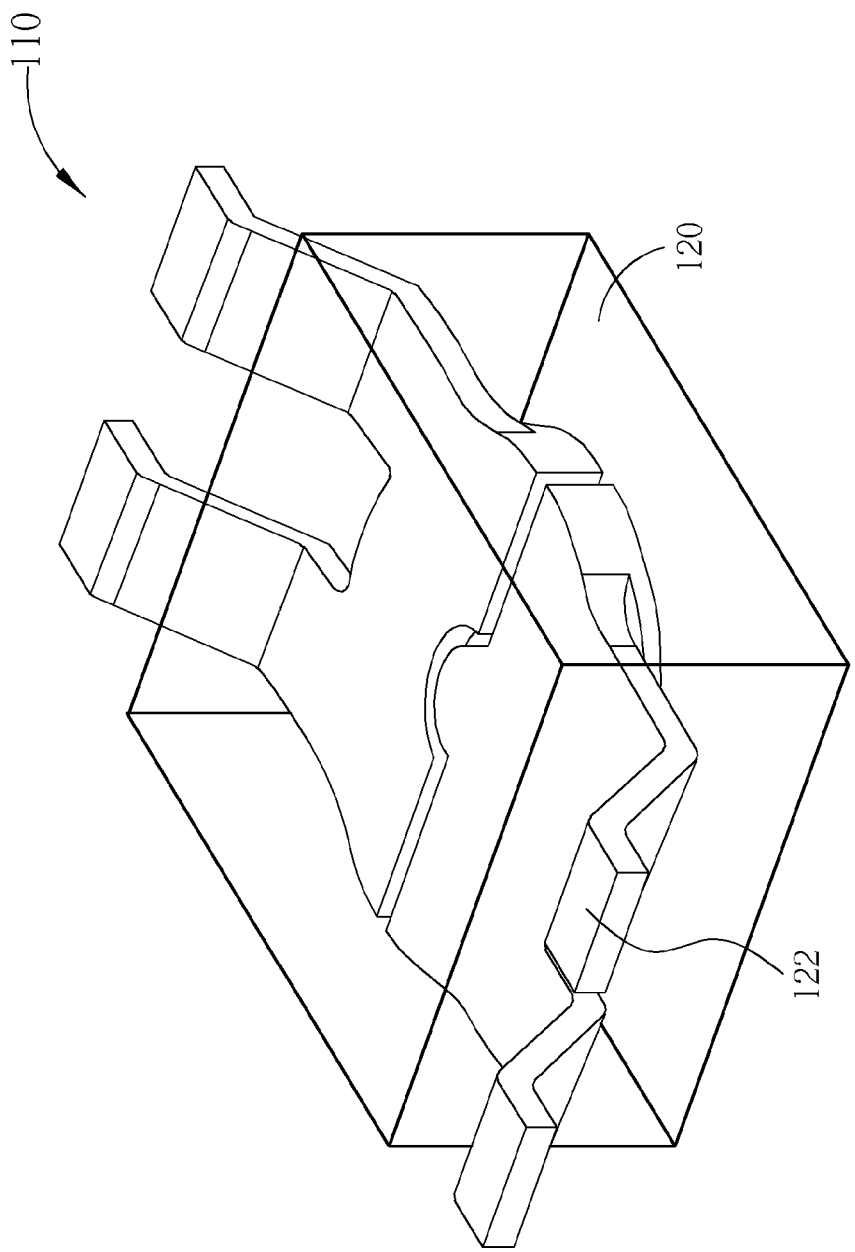
FIG. 12 illustrates a back view of the optoelectronic semiconductor component according to the fourth embodiment of the present invention.

Referring to FIGS. 11-12, FIG. 11 illustrates a frontal view of an optoelectronic semiconductor component 110 according to a fourth embodiment of the present invention, and FIG. 12 illustrates a back view of the optoelectronic semiconductor component 110. The optoelectronic semiconductor component 110 is preferably a surface mount device light emitting diode package, in which the optoelectronic semiconductor component 110 includes a plurality of light emitting chips 112 for emitting light and a reflective substrate 116 having a plurality of linear indented structures 118 thereon. The light emitting chip 112 is a light emitting diode chip, and the light emitting chip 112 is installed on the reflective substrate 116 and positioned on one side of the linear indented structures 118. The optoelectronic semiconductor component 110 also includes an encapsulant 120 for protecting the light emitting chip 112, in which the encapsulant 120 is formed by transfer molding to cover the reflective substrate 116 and the light emitting chip 112. The encapsulant 120 is composed of epoxy or silicon, which may also contain substances such as fluorescent materials, light dispersing materials, or ink. An electrode 122 is formed to receive electricity from an external power supply. The utilization of the linear indented structures 118 for reflecting light emitted by the light emitting chip 112 is similar to the previous embodiment and the details of which are not further explained herein for the sake of brevity.

Figure 13:
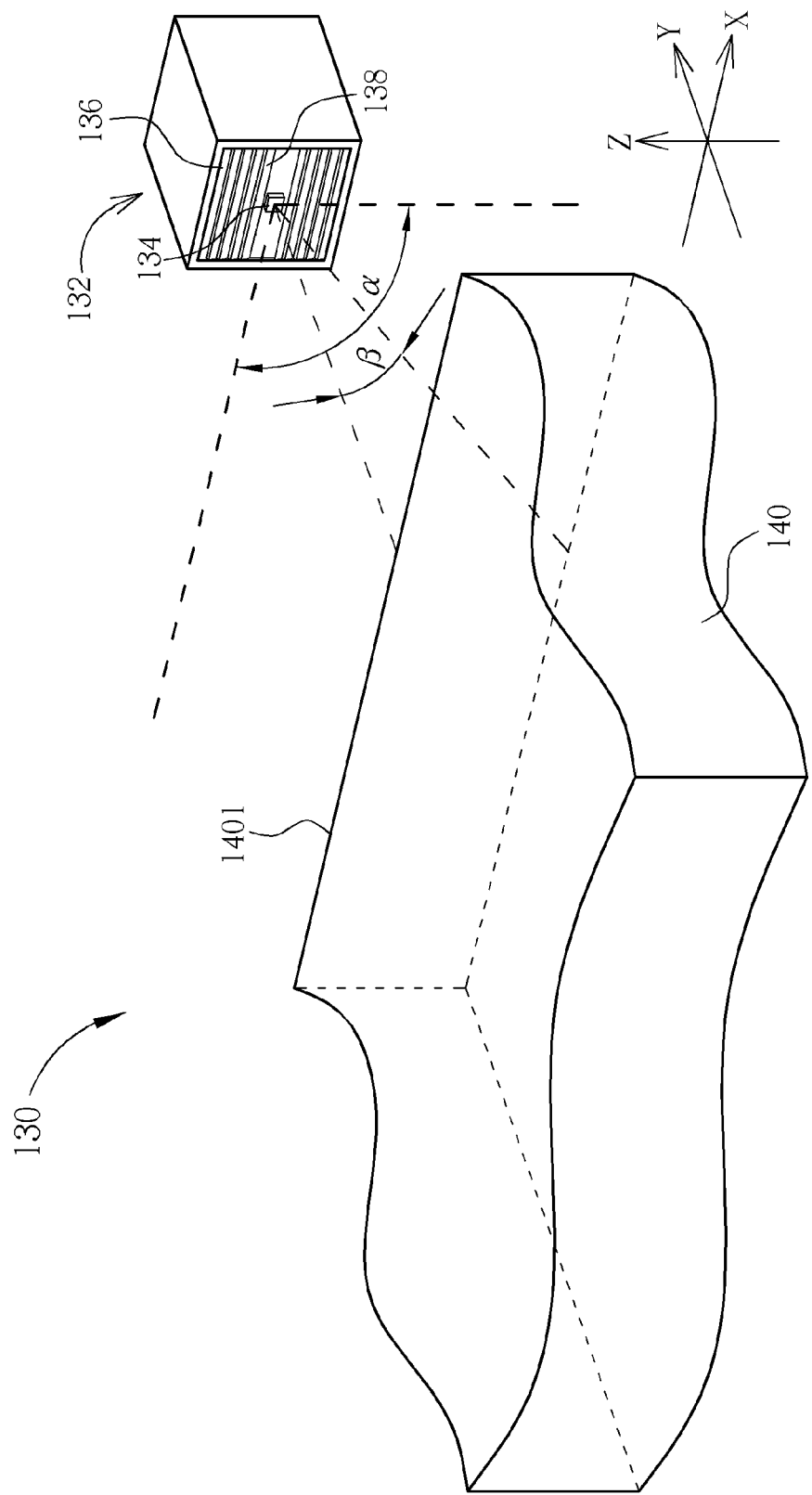
FIG. 13 illustrates a perspective view of a side-emitting backlight module according to an embodiment of the present invention.

Preferably, the aforementioned optoelectronic semiconductor component can be used as a light source for the backlight module of a liquid crystal display. Referring to FIG. 13, FIG. 13 illustrates a perspective view of a side-emitting backlight module 130 according to an embodiment of the present invention. The side-emitting backlight module 130 includes an optoelectronic semiconductor component 132, in which the optoelectronic semiconductor component 132 further includes a light emitting chip 134 for emitting light and a reflective substrate 136 for reflecting light emitting by the light emitting chip 134. A plurality of linear indented structures 138 is also formed on the reflective substrate 136. The side-emitting backlight module 130 also includes a light guiding plate 140 installed on one side of the optoelectronic semiconductor component 132, in which the light guiding plate 140 is used to guide light directed by the linear indented structures 138 to a display panel (not shown). In contrast to the aforementioned embodiment, the linear indented structures 138 of this embodiment is arranged according to a unidirectional manner, such that the linear indented structures 138 are substantially parallel to a side 1401 of the light guiding plate 140 (according to the X direction). As the linear indented structures 138 have the characteristic of gathering lights and reducing the incident angle perpendicular to the linear indented structures 138 (such as the angle with respect to Z direction), the emitted lights could be centralized before entering the light guiding plate 140 to improve the overall performance and optical coupling of the optoelectronic semiconductor component 132. For instance, if the incident angle obtained without using the linear indented structures 138 were $\alpha$, the incident angle collected after the utilization of the linear indented structures 138 would be $\beta$, in which $\beta<\alpha$. Moreover, if the linear indented structures 138 were formed substantially vertical to the side 1401 (such as the Z direction) of the light guiding plate 140, the incident angle (with respect to the X direction) perpendicular to the linear indented structures would be reduced, which could be further used to adjust the working range of the light projecting from the component 132 to the light guiding plate 140. Hence, if a plurality of optoelectronic semiconductor components 132 were used as the light source for the side-emitting backlight module 130, the location of the semiconductor components 132 could be adjusted according to the demand of product.

In contrast to the conventional technique, the optoelectronic semiconductor component of the present invention specifically uses a reflective substrate having a plurality of linear indented structures to reflect light emitted by the light emitting chip. As each of the linear indented structures is disposed to form an analogous Fresnel Lens, which has the characteristic for gathering emitted light, the present invention could centralize light emitted by the light emitting chip by preventing light from scattering to all different direction, thereby increasing the overall brightness of the optoelectronic semiconductor component. By using the design of the present invention, the present invention could maintain the advantage of using the conventional planar lens design while eliminating the need of installing a dome lens, which not only facilitates the utilization of surface mounting technique to fabricate the optoelectronic semiconductor device, but also controls the incident angle of light exiting the device accordingly. Overall, the luminance and optical coupling of the optoelectronic semiconductor component are significantly increased and the applicable field of this component is expanded.

Those skilled in the art will readily observe that numerous modifications and alterations of the device and method may be made while retaining the teachings of the invention.

What is claimed is:

1. An optoelectronic semiconductor component, comprising:
   a light emitting chip for emitting light;
   a reflective substrate having a plurality of linear indented structures thereon, and
   an encapsulant covering the light emitting chip and the linear indented structures;
   wherein the light emitting chip is installed on the reflective substrate and positioned on one side of the linear indented structures, and the linear indented structures are capable of reflecting light emitted from the light emitting chip.

2. The optoelectronic semiconductor component of claim 1, wherein each of the linear indented structures forms a Fresnel Lens.

3. The optoelectronic semiconductor component of claim 1, wherein the linear indented structures surround the light emitting chip.

4. The optoelectronic semiconductor component of claim 3, wherein the linear indented structures surround the light emitting chip according to a circular manner.

5. The optoelectronic semiconductor component of claim 3, wherein the linear indented structures surround the light emitting chip according to an elliptical manner.

6. The optoelectronic semiconductor component of claim 1, wherein the linear indented structures arranged according to a unidirectional manner.

7. The optoelectronic semiconductor component of claim 1, wherein the reflective substrate comprises metal.

8. The optoelectronic semiconductor component of claim 1, wherein the reflective substrate comprises plastic and a high reflective material evaporated thereon.

9. The optoelectronic semiconductor component of claim 1, wherein the reflective substrate comprises a metal electroplated thereon.

10. The optoelectronic semiconductor component of claim 1, wherein the linear indented structures are formed by injection molding.

11. The optoelectronic semiconductor component of claim 1, wherein the linear indented structures are formed by stamping.

12. The optoelectronic semiconductor component of claim 1, wherein the light emitting chip comprises a light emitting diode chip.

13. The optoelectronic semiconductor component of claim 12, wherein the light emitting diode chip comprises a plastic leaded chip carrier light emitting diode chip.

14. The optoelectronic semiconductor component of claim 12, wherein the light emitting diode chip comprises a surface mount device light emitting diode chip.

15. The optoelectronic semiconductor component of claim 1, wherein the encapsulant comprises epoxy or silicone.

16. The optoelectronic semiconductor component of claim 1, further comprising a reflective base, wherein the reflective substrate is installed on one side of the reflective base.

17. A side-emitting backlight module, comprising:
an optoelectronic semiconductor component, comprising:
a light emitting chip for emitting light; and
a reflective substrate having a plurality of linear indented structures thereon, wherein the light emitting chip is installed on the reflective substrate and positioned on one side of the linear indented structures, and the linear indented structures are capable of reflecting light emitted from the light emitting chip;
an encapsulant covering the light emitting chip and the linear indented structures; and
a light guiding plate installed on one side of the optoelectronic semiconductor component for guiding light reflected by the linear indented structures.

18. The side-emitting backlight module of claim 17, wherein each of the linear indented structures forms a Fresnel Lens.

19. The side-emitting backlight module of claim 17, wherein the linear indented structures surround the light emitting chip.

20. The side-emitting backlight module of claim 19, wherein the linear indented structures surround the light emitting chip according to a circular manner.

21. The side-emitting backlight module of claim 19, wherein the linear indented structures surround the light emitting chip according to an elliptical manner.

22. The side-emitting backlight module of claim 17, wherein the linear indented structures arranged according to a unidirectional manner.

23. The side-emitting backlight module of claim 17, wherein the linear indented structures are substantially parallel to one side of the light guiding plate.

24. The side-emitting backlight module of claim 17, wherein the reflective substrate comprises metal.

25. The side-emitting backlight module of claim 17, wherein the reflective substrate comprises plastic and a high reflective material evaporated thereon.

26. The side-emitting backlight module of claim 17, wherein the reflective substrate comprises a metal electroplated thereon.

27. The side-emitting backlight module of claim 17, wherein the linear indented structures are formed by injection molding.

28. The side-emitting backlight module of claim 17, wherein the linear indented structures are formed by stamping.

29. The side-emitting backlight module of claim 17, wherein the light emitting chip comprises a light emitting diode chip.

30. The side-emitting backlight module of claim 29, wherein the light emitting diode chip comprises a plastic leaded chip carrier light emitting diode chip.

31. The side-emitting backlight module of claim 29, wherein the light emitting diode chip comprises a surface mount device light emitting diode chip.

32. The side-emitting backlight module of claim 17, wherein the encapsulant comprises epoxy or silicone.

33. The side-emitting backlight module of claim 17, further comprising a reflective base, wherein the reflective substrate is installed on one side of the reflective base.

* * * * *